United States Patent [19]

Oshima

[11] Patent Number: 4,777,519

[45] Date of Patent: Oct. 11, 1988

[54] CHARGE TRANSFER DEVICE

[75] Inventor: Mitsuo Oshima, Tokyo, Japan

[73] Assignee: Oki Electric Industry Co., Ltd., Tokyo, Japan

[21] Appl. No.: 903,946

[22] Filed: Sep. 2, 1986

[30] Foreign Application Priority Data

Sep. 17, 1985 [JP] Japan .................... 60-204676

[51] Int. Cl.$^4$ .............................. H01L 29/78
[52] U.S. Cl. ...................... 357/24; 358/213.26; 358/213.15; 358/221; 365/183; 365/208; 307/444; 364/862; 377/63
[58] Field of Search ............................ 357/24

[56] References Cited

U.S. PATENT DOCUMENTS

| 3,944,849 | 3/1976 | Tasch | 357/24 |
| 4,371,885 | 2/1983 | Parrish et al. | 357/24 |
| 4,380,056 | 4/1983 | Parrish et al. | 357/24 |
| 4,539,596 | 9/1985 | Elabd | 357/24 |

Primary Examiner—Robert S. Macon
Attorney, Agent, or Firm—Spencer & Frank

[57] ABSTRACT

In an SPS charge transfer device comprising a parallel register having a plurality of signal transfer channels for transferring signal charges, and a first and a second serial registers, a plurality of noise transfer channels for transferring noise charges due to a dark current are formed adjacent to and parallel with the signal transfer channels. The signal charges are transferred through the signal transfer channels toward the second serial register, and then through the second serial register, while the noise charges are transferred through the noise transfer channels toward the first serial register, and then through the first serial register. The signal charges at the output end of the second serial register and the noise charges at the output end of the first serial register are used to produce signals representing the signal charges which are originally introduced into the parallel register, i.e., the signal charges from which the noise components due to the dark current have been removed.

10 Claims, 6 Drawing Sheets

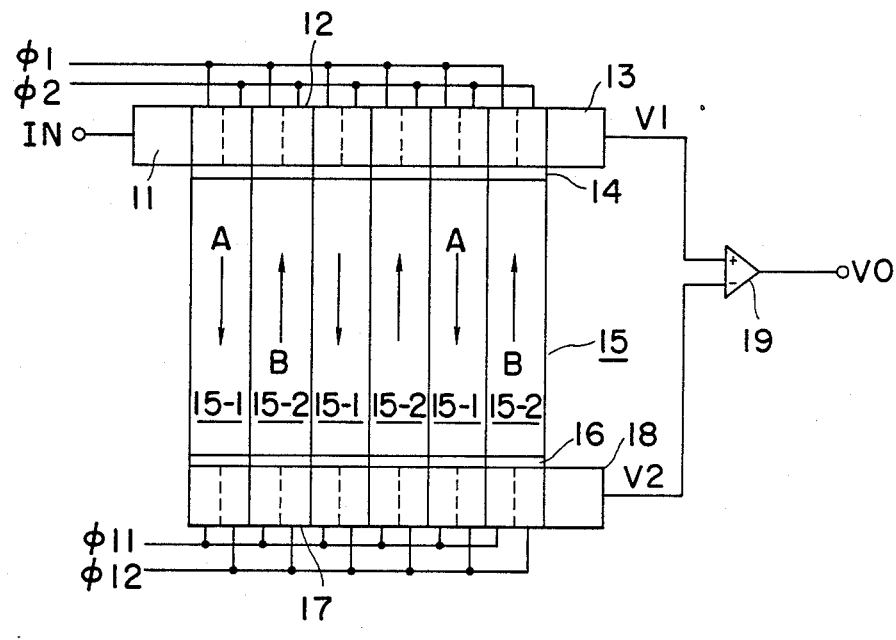
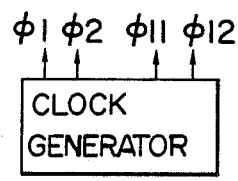
F I G. 4

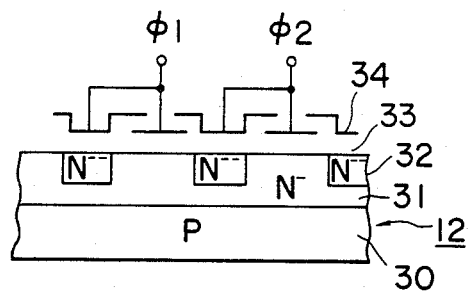
F I G. 5
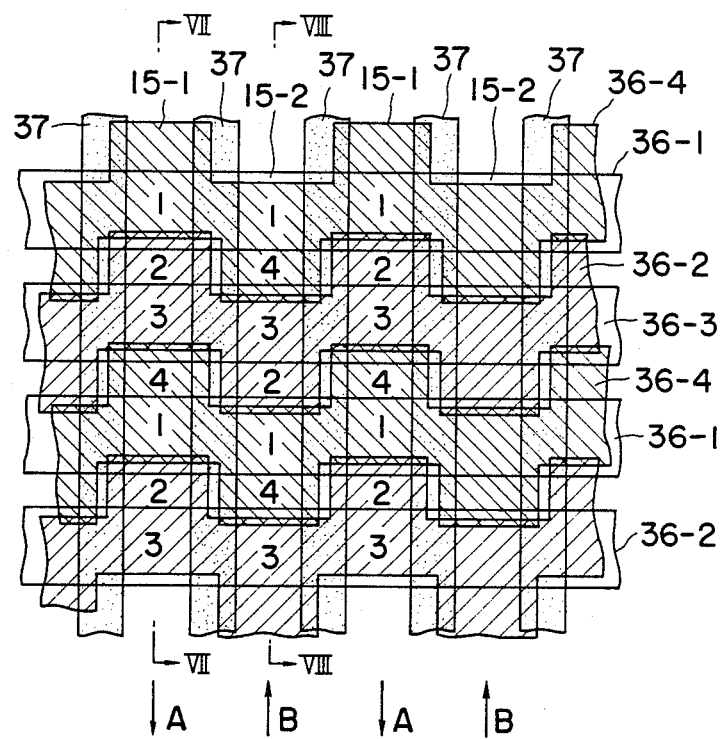
F I G. 6

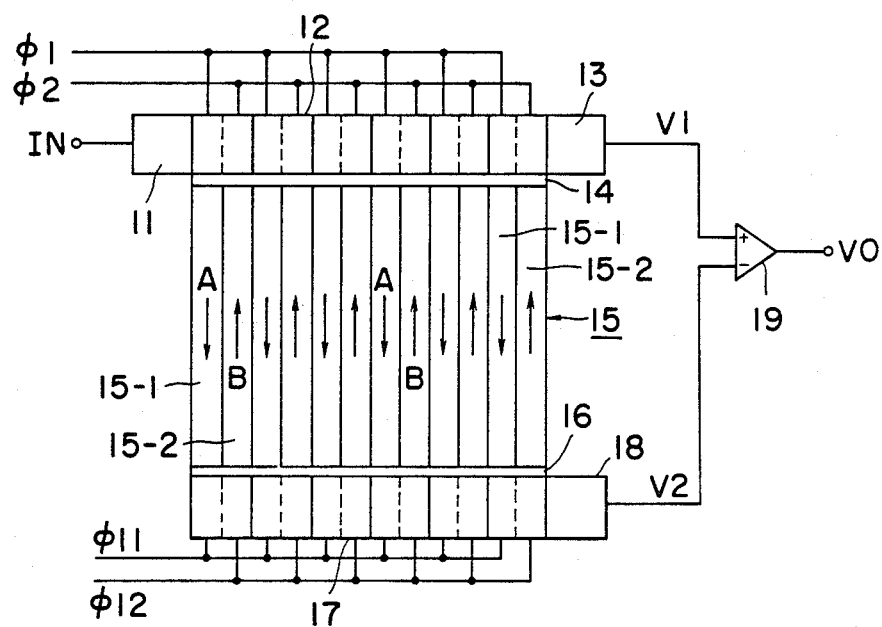
F I G. 13

CHARGE TRANSFER DEVICE

BACKGROUND OF THE INVENTION

The present invention relates to a charge transfer device, particularly one for use as a CCD (charge coupled device) analog field memory.

An example of a conventional CCD analog field memory is shown in the Transactions of the Institute of Electronics and Communication Engineers of Japan, ED84-76 (1984), pp. 47-62, and will be described with reference to FIG. 2.

As illustrated in FIG. 1, the analog field memory comprises an input circuit 1 sampling an analog signal, an input serial reister 2 havin a pluralitY of stages connected to the input circuit 1, a parallel reister 4 having a plurality of channels connected through transfer gates 3 to the input serial reister 2, an output serial register 6 having a plurality of stages connected through transfer gates 5 to the parallel register 4, and an output circuit 7 connected to the output serial register 6. The output circuit 7 converts the signal charges through the output serial register 6 into voltage signals or current signals and produces them as output signals. A device having such a structure is generally called an SPS (serial-parallel-serial) charge transfer device.

When an analog signal IN is sampled by the input circuit 1, a signal charge corresponding to the sample value of the analog signal is inputted to the first stage of the input serial register 2. The inputted charge is transferred through the input serial register 2 in accordance with clock pulses applied to the input serial register 2. When all the stages of the input serial register 2 are filled with the signal charges, the transfer gates 3 are opened in accordance with a clock pulse, and the signal charges are transferred to the parallel register 4. Such an operation is repeated, and the signal charges within the parallel register 4 are transferred, in accordance with clock pulses applied to the parallel register 4, toward the output serial register 6 (in the direction of arrow A in FIG. 1).

When the signal charges arrive at the final stages of the parallel register 4, the transfer gates 5 are opened in accordance with a clock pulse, and the signal charges in the final stages of the parallel register 4 are concurrently transferred to the output serial register 6. The signal charges in the output serial register 6 are successively outputted in time sequence through the output circuit 7 in accordance with clock pulses applied to the output serial register 6.

FIG. 2 shows waveforms of the signals which appear where the output signals from the output circuit 7 do not contain noises.

The device of the above described arrangement has the following problems.

(1) When signal charges are transferred through a silicon chip forming the charge transfer device, a leak current called a dark current may flow. If such a dark current flows, noise charges occur because of the dark current, resulting in noise signals X which are superimposed, as is shown in FIG. 3, on the signal charges to be transferred. As a result, the output signals are distorted. Such an effect is greater as the ambient temperature of the silicon chip is increased.

(2) The signal degradation due to the dark current differs from one stage to another of the output serial register 6. Where the correction of the output signals is made outside, the output signals from the outut serial register 6 are digitized and then stored in a digital memory, and the stored values are converted into analog signals and the resultant values ar used to obtain differences for the respective stages of the output serial register, thus requiring complicated circuits.

SUMMARY OF THE INVENTION

An object of the present invention is to provide a charge transfer device which can avoid signal degradation due to the dark current, without resorting to complicated circuits.

According to the invention, there is provided a charge transfer device comprising, a parallel register having a plurality of signal transfer channels for transferring in parrallel signal charges, a first serial register coupled to a first end of the parallel register, a second serial register coupled to a second end of the parallel register for serially transferring the signal charges which have been transferred through the parallel register, a plurality of noise transfer channels formed adjacent to and parallel with the signal transfer channels for transferring noise charges due to a dark current, drive means for causing transfer of the signal charges through the signal transfer channels toward the second serial register, and transfer of the noise charges through the noise transfer channels toward the first serial register, said first serial register transferring the noise charges which have been transferred through the noise transfer channels, and means responsive to the signal charges which have been transferred through the second serial register and the noise charges which have been transferred through the first serial register for producing signals representing the signal charges from which the noise components due to the dark current have been removed.

BRIEF DESCRIPTION OF THE DRAWINGS

In the accompanying drawings:

FIG. 4 is a schematic diagram showing a charge transfer device of an embodiment of the invention;

FIG. 5 is a partial sectional view of the input serial register in FIG. 4;

FIG. 6 is a partial plan view of the parallel register in FIG. 4;

FIG. 13 is a schematic diagram showing another embodiment of a charge transfer device of the invention.

DETAILED DESCRIPTION OF THE PREFERRED EMBODIMTS

Figure 1:
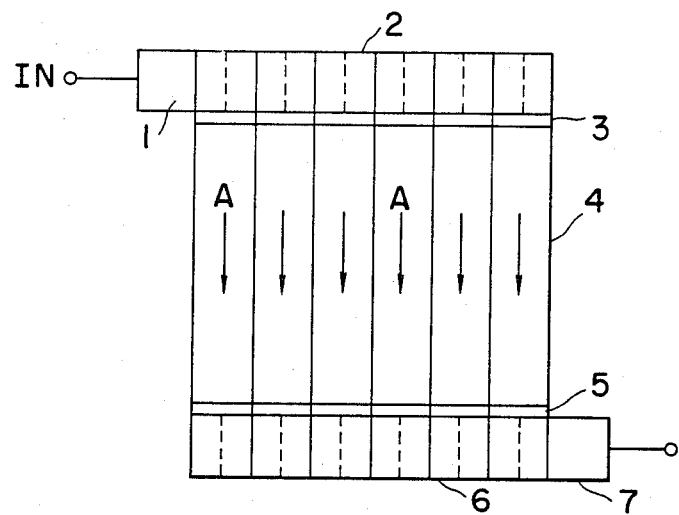
FIG. 1 is a schematic diagram showing a prior art charge transfer device.
Figure 2:
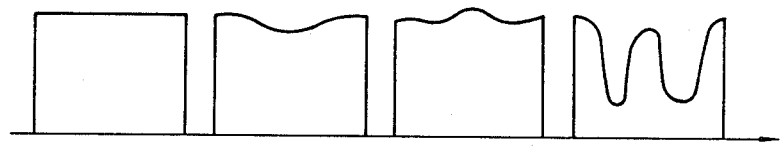
FIG. 2 and FIG. 3 are output signal waveform diagrams showing the operation of FIG. 1.
Figure 3:
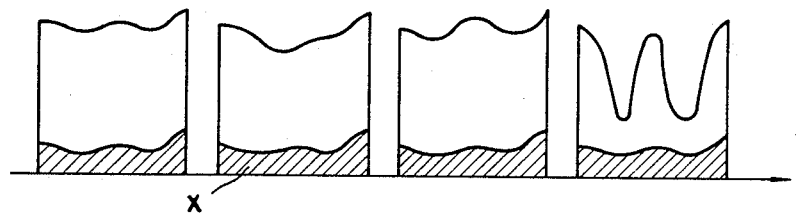

FIG. 4 is a schematic diagram showing a charge transfer device of an embodiment of the invention.

As illustrated, the charge transfer device comprises an input circuit 11 which samples an analog signal IN each time a clock pulse is applied. It injects, upon each sampling a signal charge corresponding to the sample value of the analog signal IN. As a succession of clock pluses are applied, the input circuit 11 successively injects signal charges.

A two-phase driven input serial register 12 having a plurality of stages is connected, at its one or first end thereof, to the input circuit 11, and transfers the injected signal charges in accordance with two-phase clock pulses $\phi1$, $\phi2$. Connected to the other or a second end of the input serial register 12 is an output circuit 13 which converts the charges into voltage signals and produces them as output signals V1.

A four-phase driven parallel register 15 having a plurality of channels is connected to the input serial register 12 through transfer gates 14. The parallel reister 15 comprises a first set of channels 15-1 and a second set of channels 15-2. The first and t..e second sets of channels 15-1, 15-2 are arranged alternately and are connected, at one end thereof, to the respective stages of the input serial register 20 through the transfer gates 14.

More particularly, the first set of channels are coupled to the alternate stages, while the second set of channels are coupled to the intervening stages.

The first and the second sets of channels 15-1, 15-2 are connected through transfer gates 16 to the respective stages of a two-phase driven output serial register 17 having a plurality of stages. The first set of channels transfer charges in the direction from the input serial register to the output serial register 17, (in the direction of the arrow (A), while the second set of channels 15-2 transfer noise charges, to be described later, in the opposite direction (in the direction of the arrow B). Each of the channels 15-1, 15-2 is formed of a plurality of stages.

The output serial register 11 transfers charges in accordance with two-phase clock pulses $\phi11$, $\phi12$. Connected to the output end of the output serial register 17 is an output circuit 18 which converts the signal charges into voltage signals and produces them as output signals V2.

Connected to the output circuits 13, 18 is a differential amplifier 19, by which the differences between the two output signals V1, V2 are determined and outputted as output signals V0.

The charges which have been transferred through the first set of channels 11-1, and the output serial register 17 are signal charges, representing the sample values of the analog signal, with noise charge components introduced during the transfer. The charges which have been transferred through the second set of channels 15-2, and the input serial register 12 are noise charges representing the noise charge components due to the dark current. The difference beteen them will therefore reflect the original sample values of the analog signal IN, or to be more exact, the signal as transferred from the input serial register 12 to the parallel register 15.

FIG. 5 is a partial sectional view of the input serial register 12. As illustrated, an N⁻ region 31 is formed within a P-type silicon substrate 30, and an N⁻⁻ region 32 is formed within the N³¹ region 31. Formed over the N⁻ region 31 and the N⁻⁻ region 32 are two-phase gate electrodes 34 with an oxide film interposed therebetween. The area under each of the electrodes 34 forms a charge storage site. Each stage of the input serial register 12 is formed of a pair of storage sites under a pair of electrodes 34 which operate in accordance with the clock pulses $\phi1$, $\phi2$. By application of the clock pulses $\phi1$, $\phi2$ to the gate electrodes 34. the signal charges within the N⁻ region 31 are transferred through the areas beneath the gate electrodes 34. In the illustrated embodiment, the channels 15-1, 15-2 are both connected through transfer gates, not shown, to the charge storage sites under electrodes operating on the clock 1. The output serial register 17 has a structure similar to the input serial register 12.

Figure 7:
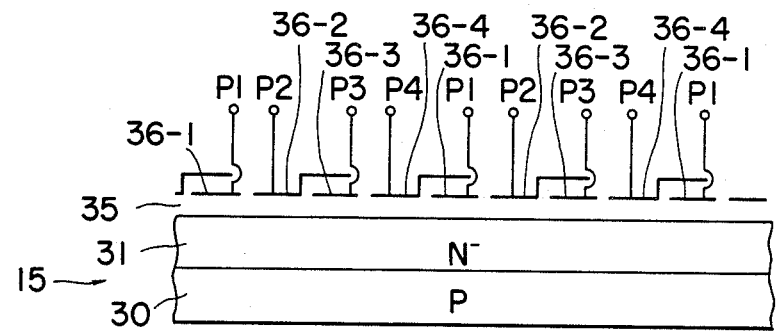
FIG. 7 and FIG. 8 are partial sectional views along the lines VII—VII and VIII—VIII. respectively, in FIG. 6.
Figure 8:
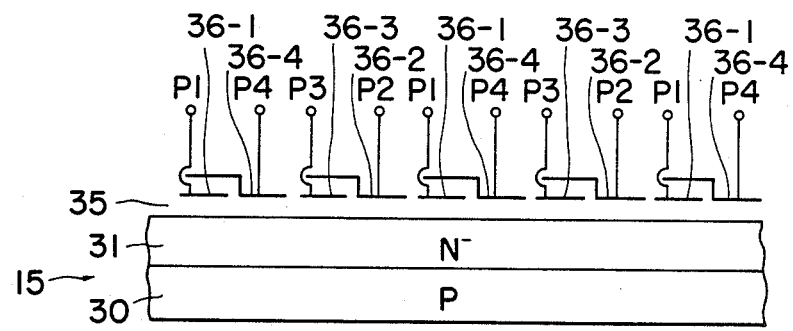

FIG. 6 is a partial plan view of the parallel register 15. FIGS. 7 and 8 are partial sectional views along the lines VII—VII and VIII—VIII, respectively, in FIG. 6. As illustrated, the channels 15-1, 15-2 extending vertically from the input serial register 12 to the output serial register 17 and are separated by strip-shaped, channel stoppers 37. In each of the channels 15-1, 15-2, an N region 31 is formed within a P-type silicon substrate 30. Four-phase poly-silicon gate electrodes 36-1 throuh 36-4 are formed over the N⁻ region 31 with an oxide film 35 interposed therebetween. The area under each of the electrodes 36-1 through 36-4 forms a charge storage site. Each stage of each channel is formed of four charge storage sites under four successive electrodes 36-1 through 36-4. By application of clock pulses P1-P4 to the gate electrodes 36-1 through 36-4 of the respective phases, the charges within the N⁻ region 31 are transferred through the charge storage sites beneath the gate electrodes. The direction of the charge transfer within the channels 15-1 is made to be from the input serial register 12 to the output serial register 17, while the direction of the chare transfer within the channels 15-2 is made to be from the output serial register 17 to the input serial register 12. To realize this, the electrodes are formed as illustrated. More particularly, the electrodes extend generally perpendicular to the channels and are arranged one above the other. The gate electrodes 36-1, 36-3 have the same shape of strip. The gate electrodes 36-2, 36-4 are provided between the gate electrodes 36-1, 36-3 and the connecting portions of the gate electrodes 36-2, 36-4 are formed over the gate electrodes 36-1, 36-3 with an oxide film interposed therebetween. In the illustrated example the gate electrodes 36-2, 36-4 in the channels 15-1 are positioned beneath (as viewed in FIG. 6) or to the right of (as viewed in FIGS. 7, 8) the electrodes 36-1, 36-3, respectively. The gate electrodes 36-2, 36-4 in the channels 15-2, are positioned over (as viewed in FIG. 6) or to the left of (as viewed in FIGS. 7, 8) the electrodes 36-1, 36-3, respectively.

Figure 9:
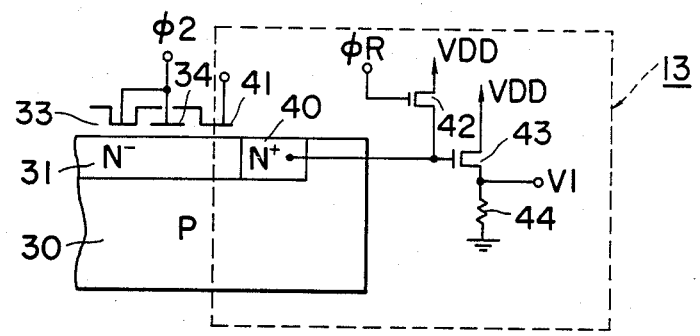
FIG. 9 is a schematic diagram of the output circuit in FIG. 4.

FIG. 9 is a schematic view of the output circuit 13. The output circuit 13 has an N⁺ region 40 formed adjacent to the N⁻ region 31 at the output end of the input serial register 12. An output gate electrode 41 is formed over the N⁺ region 31 with an oxide film 33 interposed therebetween. Connected to the N⁺ region 40 are the source of a MOS transister 42 and the gate of a MOS transistor 43. The MOS transistor 42 has its drain connected to a power supply VDD and is turned on in accordance with a reset pulse $\phi R$ applied to is gate. The MOB transistor 43 has its drain connected to a power supply VDD and its source connected through a load resistor 44 to the ground.

By a signal applied to the output gate electrode 41, a signal charge is taken out of the N⁺ region 40, and is applied to the gate of the MOS transister 43, which operates in the unsaturated region and amplifies the gate input to produce an output signal V1 corresponding to the signal charge taken out of the N+ region 40, at the source of the MOS transistor 43. When the MOS transistor 42 is turned on by the reset pulse $\phi R$, the charge in the region 40, is discharged through the MOS transistor 42, so as to be ready for the next output operation.

All the clocks are supplied from a clock generator 50 schematically illustrated, which forms a part of a driver for the registers.

Figure 10:
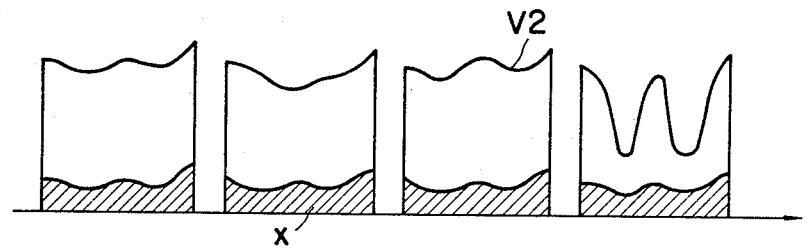
FIG. 10, FIG. 11 and FIG. 12 are waveform diagrams showing output signals of FIG. 4.
Figure 11:
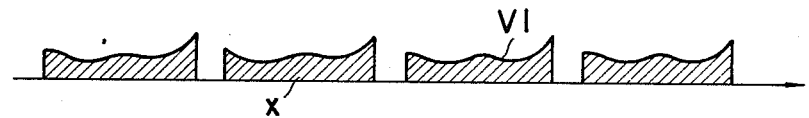
Figure 12:
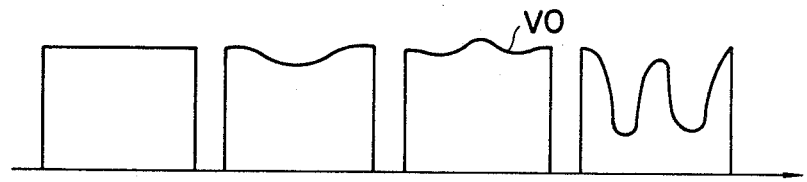

The operation of the charge transfer device organized as described above will now be described with reference to the signal waveform diagrams of FIGS. 10-12. FIG. 10 is the waveform diagram of the output signal V2 of the output circuit 18, FIG. 11 is the waveform diagram of the output signal V1 of the output circuit 13 and FIG. 12 is the waveform diagram of the output signal V0 of the differential amplifier 19.

As an analog signal IN is applied to the input circuit 11, the input circuit 11 samples the analog signal IN in accordance with a clock supplied to it, and inputs, to the input serial register 12, a signal charge respresenting the sample value of the analog signal IN. As the clock pulse is applied to the input clrcuit 11, signal charges are successively inputted into the input serial register 12. The signal charges which have been inputted, are transferred to the succeeding stages in accordance with the clock pulses $\phi 1$, $\phi 2$. The clock pulses $\phi 1$, $\phi 2$ have a frequency twice that of the clock pulses applied to the input circuit 11 for the sampling. When the signal charges have been inputted into all of the alternate stages, e.g., odd-numbered (as counted from the input end) stages, of the input serial register 12, the transfer gates 14 are opened in accordance with a clock pulse and the signal charges are transferred into the signal transfer channels 15-1 of the parallel register 15.

The signal charges which have been inputted into the first set of channels 15-1 are transferred therethrough toward the output serial register 17 (in the direction of the arrow A) in accordance with the clock pulses P1 through P4. If noise charges are generated, they enter into the first and the second sets of channels 15-1, 15-2 to the same degree. As a result, the signal charges with the noise charges superimposed thereon are transferred through the first set of channels 15-1 toward the output serial register 11, while the noise charges alone are transferred through the second registers 15-2 toward the input serial register 12 (in the direction of the arrow (B) in accordance with the clock pulses P1 through P4.

When the signal charges arrive at the final stages of the first set of channels 15-1, the transfer gates 16 are opened in accordance with a clock pulse and the signal charges are concurrently transferred to the output serial register 17. The output serial register 17 transfers the signal charges toward the output circuit 18 in accordance with the clock pulses $\phi 11$, $\phi 12$. The output circuit 18 takes the signal charges and produces corresponding output signals V2. The output signals V2 control noise signals X, as illustrated in FIG. 10 due to the dark current, and are supplied to the differential amplifier 19.

When the noise charges arrive at the final stages (the stages adjacent to the input serial register 12) of the second set of channels 15-2, the transfer gates 14 are opened after completion of the signal transfer from the input serial register 12 to the first set of channels 15-1, and the noise charges within the second set of channels 15-2 are concurrently transferred to alternate stages, e.g., even-numbered (as counted from the input end) stages, of the input serial register 12. The noise charges which have been inputted into the input serial register 12 are transferred toward the output circuit 13. The output circuit 13 converts the noise charges into corresponding voltage signals, and successively outputs the output signals V11 in a time sequence. The output signals V1 consist, as illustrated in FIG. 11, of the noise signals X alone and are supplied to the differential amplifier 19.

The differential amplifier 19 determines the differences between the output signals V1 V2. The output signals V0 is, as illustrated in FIG. 12, of an ideal output waveform in that the noise components have been eliminated.

As the noise charges are transferred through the input serial register 12 toward the output circuit 13, the next line of signal charges are supplied from the input circuit 11 and are transferred through the input serial register 12, following the line of noise charges.

According to the embodiment described, the noise charges due to the dark current are trasferred by the second set of channels 15-2 and the input serial register 12, and are taken out by the output circuit 13 as the output signals V1, which are then subtracted from the output signals V2. The noise signal components X are thus easily removed. Moveover, such processing is achieved only with analog circuits, so that the circuit configuration is easy. The parallel register 15 comprises the first and the second sets of channels 15-1, 15-2, but they can be easily fabricated with the use of a production process of a prior art apparatus, by simply changing the pattern layout.

FIG. 13 is a schematic diagram of a charge transfer device of another embodiment of the invention.

This embodiment differs from the embodiment of FIG. 4 in that the width of a pair of channels adjacent to each other, such as the first and second sets of channels 15-1, 15-2 in the parallel reister 15, is made to be about the same as the length per stage of the input serial register 12 and the output serial register 17. The channels 15-1 are coupled to the charge storage sites under the electrodes 34 corresponding to $\phi 1$ or $\phi 11$, while the channel 15-2 are coupled to the charge storage sites under the electodes 34 corresponding to $\phi 2$, or $\phi 12$. In other words, the channels 15-1 are coupled to the alternate charge storage sites of the input serial register 12 and of the output serial resister 17, while the channels 15-2 are coupled to the intervening charge storage sites. The transfer of the signal charges from the input serial register 12 to the parallel register 15 is made by the gates and the charge storage sites corresponding to the clock pulse $\phi 1$, while the input of the noise charges into the input serial register 12 is made by the gates and the charge storage sites corresponding to the clock pulse $\phi 2$.

The frequency of the clock pulses $\phi 1$, $\phi 2$ is the same as the frequency of the sampling by the input circuit 11. When all of the alternate charge storage sites under the gate electrodes corresponding to $\phi 1$ are filled with the charges, the signal charges are transferred by means of the transfer gates 14 to the first set of channels 15-1 of the parallel register 15, after which the noise charges are transferred from the second set of channels 15-2 to the charge storage sites under the gate electrodes corresponding to $\phi 2$. The noise charges are transferred toward the output circuit 13, following which the next line of signal charges are transferred from the input circuit 11, and thus a similar operation is repeated.

With such an arrangement, the merits similar to those of the embodiment of FIG. 4 are attained and the size of the device can be reduced. In other words, the same number of bits can be obtained on the same area as in the prior art device.

The present invention is not limited to the illustrated embodiments, but various modifications can be made. For instance, the input circuit 11 and the output circuits 13, 18 may be formed of other circuits. The input serial register 12, the output serial register 17 and the parallel register 15 may be modified into a structure which are driven by clock pulses of different number of phases.

As has been described in detail, according to the present invention, the parallel register comprises a first and a second sets of channels. The second set of channels transfer noise charges alone, which are taken out through the input serial register and the output circuit connected thereto. The noise charges are therefore easily detected. Moreover, the difference between the output taken out through the output serial register and the output circuit connected thereto, and the output taken out through the input serial register and the output circuit connected thereto is determined, so that correction of the signal deterioration can be made accurately with a simple structure.

What is claimed is:

1. A charge transfer device comprising:
 a parallel register having a plurality of signal transfer channels for transferring in parallel signal charges,
 a first serial register coupled to a first end of the parallel register,
 a second serial register coupled to a second end of the parallel register for serially transferring the signal charges which have been transferred through the parallel register,
 a plurality of noise transfer channels formed adjacent to and parallel with the signal transfer channels for transferring noise charges due to a dark current,
 drive means for causing transfer of the signal charges through the signal transfer channels toward the second serial register, and transfer of the noise charges through the noise transfer channels toward the first serial register,
 said first serial register transferring the noise charges which have been transferred through the noise transfer channels, and
 means responsive to the signal charges which have been transferred through the second serial register and the noise charges which have been transferred through the first serial register for producing signals representing the signal charges from which the noise components due to the dark current have been removed.

2. A device according to claim 1, further comprising an input circuit for sampling an analog signal, and wherein the first serial register has a first end coupled to the input circuit to receive signal charges representing the sample values of the analog signal, and transfers the signal charges, and the parallel register transfers the signal charges which have been transferred through the first serial register.

3. A device according to claim 1, wherein said signal producing means comprises mean comparing the signal charges which have been transferred through one of the signal transfer channels, with the noise charges which have been transferred through one of the noise transfer channels adjacent to said one of the signal transfer channels.

4. A device according to claim 3, wherein said drive means causes the signal charges which have been transferred through one of the signal transfer channels and the noise charges which have been transferred through one of the noise transfer channels adjacent to said one of the signal transfer channels to arrive concurrently at the output ends of the second and the first serial registers.

5. A device according to claim 1, wherein each of the first and the second serial registers has a plurality of charge storage sites, a first end of each of the signal transfer channels and the noise transfer channels is coupled to one of the charge storage sites of the first serial register, and a second end of each of the signal transfer channels and the noise transfer channels is coupled to one of the charge storage sites of the second serial register.

6. A device according to claim 1, wherein the signal transfer channels and the noise transfer channels are arranged alternately.

7. A device according to claim 1, wherein said drive means cause the transfer of the noise charges from the noise transfer channels to the first serial register after the transfer of the signal charges from the first serial register to the signal transfer channels.

8. A device according to claim 1, further comprising an input circuit for sampling an analog signal, wherein
 the first serial register is two-phase driven, has a plurality of charge storage sites, and has a first end coupled to the input circuit to receive signal charges representing the sample values of the analog signal, and transfers the signal charges,
 the signal transfer channels of the parallel register transfer the signal charges which have been transferred through the first register,
 the signal transfer channels and the noise transfer channels are arranged alternately,
 first ends of the signal transfer channels are coupled to the alternate charge storage sites of the first serial register, and
 first ends of the noise transfer channels are couple to the intervening charge storage sites of the first serial register.

9. A device according to claim 8, wherein said drive means causes the signal charges to be transferred to the charge storage sites in the first serial register to which the first ends of the signal transfer channels are coupled.

10. A device according to claim 8, wherein
 the second serial register is two-phase driven, and has a plurality of storage sites,
 second ends of the signal transfer channels are coupled to the alternate charge storage sites of the second serial register, and
 second ends of the noise transfer channels coupled to the intervening charge storage sites of the second serial register.

* * * * *